(12) United States Patent
Kim et al.

(10) Patent No.: US 7,767,596 B2
(45) Date of Patent: Aug. 3, 2010

(54) WAFER SUPPORT PIN FOR PREVENTING SLIP DISLOCATION DURING ANNEALING OF WATER AND WAFER ANNEALING METHOD USING THE SAME

(75) Inventors: Kun Kim, Gumi-si (KR); Jin-Kyun Hong, Gumi-si (KR); Woo-Hyun Seo, Cheongju-si (KR); Kyoung-Hwan Song, Busan (KR)

(73) Assignee: Siltron, Inc., Gumi (KR)

( * ) Notice: Subject to any disclaimer, the term of this patent is extended or adjusted under 35 U.S.C. 154(b) by 161 days.

(21) Appl. No.: 12/005,415

(22) Filed: Dec. 26, 2007

(65) Prior Publication Data

US 2008/0176415 A1   Jul. 24, 2008

(30) Foreign Application Priority Data

Dec. 27, 2006   (KR) .................... 10-2006-0134791

(51) Int. Cl.
 *H01L 21/26* (2006.01)

(52) U.S. Cl. .............. 438/795; 438/709; 438/711; 438/718; 438/767; 118/620; 118/712; 118/715; 118/729

(58) Field of Classification Search ............ 438/709
See application file for complete search history.

(56) References Cited

U.S. PATENT DOCUMENTS

2007/0006806 A1*  1/2007  Imai ..................... 118/620

FOREIGN PATENT DOCUMENTS

| KR | 10-0226374 | 10/1996 |
| KR | 2001-0067805 | 7/2001 |
| KR | 2002-0064940 | 8/2002 |

\* cited by examiner

*Primary Examiner*—N Drew Richards
*Assistant Examiner*—Kyoung Lee
(74) *Attorney, Agent, or Firm*—Greer, Burns & Crain, Ltd

(57) ABSTRACT

A wafer support pin has a front end contacted with a wafer such that the front end is flat or rounded. Thus, gravitational stress is minimized during annealing the wafer, thereby minimizing slip dislocation. This wafer support pin is suitably used for annealing of a wafer, particularly high temperature rapid thermal annealing of a large-diameter wafer.

10 Claims, 7 Drawing Sheets

(a)

(b)

(a)  (b)

(a)  (b)

(a)　　　　　　　(b)　　　　　　　(c)

WAFER SUPPORT PIN FOR PREVENTING SLIP DISLOCATION DURING ANNEALING OF WATER AND WAFER ANNEALING METHOD USING THE SAME

BACKGROUND OF THE INVENTION

1. Field of the Invention

The present invention relates to a wafer support pin used in annealing a wafer and a wafer annealing method using the same, and more particularly to a structure of a wafer support pin capable of minimizing gravitational stress applied to a wafer and also capable of minimizing heat loss to minimize slip dislocation, and a wafer annealing method using the same.

2. Description of the Related Art

An annealing process is generally carried during a semiconductor device manufacturing procedure. In case of a silicon wafer, oxygen existing in the wafer forms oxygen precipitates during the annealing process conducted in the semiconductor device manufacturing procedure. Also, during the semiconductor device manufacturing procedure, oxygen precipitates exceeding a certain level act as internal gettering sites against metal impurities that may be a contamination source, so the oxygen precipitates are inevitable essential elements. However, to a certain depth in a surface region of a wafer used for making a semiconductor device, there should be ensured a denuded zone where oxygen precipitates should not be generated. Thus, as a method for forming the denuded region without defect and a BMD (Bulk Micro-Defect) containing oxygen precipitates over a certain level in a bulk region, wafer manufacturers use long time annealing or high temperature rapid thermal annealing (RTA). In particular, in spite of many unsolved problems, the high temperature rapid thermal annealing is more used recently due to a short process time and resultant high productivity.

The high temperature rapid thermal annealing anneals a wafer for several to several ten seconds at a high temperature of 1,150 to 1,250° C., which inevitably causes slip dislocation in the wafer. If slip dislocation generated during the high temperature annealing exists on a surface, current leakage occurs in the semiconductor device manufacturing procedure, which becomes a cause of deteriorated yield. Thus, to control this problem, the rapid thermal annealing process employs a method of balancing the center of gravity of a wafer on a 0.7 R inner 3-point support points.

In the wafer on a 0.7 R inner 3-point supporting method, three sharp-ended pins made of quartz as shown in FIG. 1 are used to balance the center of gravity of a wafer on a 0.7 R inner 3-point support. In this method, the wafer and pins are contacted in a minimum area, so it is possible to minimize thermal stress caused by heat loss and deviation of thermal expansion coefficient according to the material difference of silicon and quartz, and also it is possible to minimize slip dislocation. Thus, the wafer on a 0.7 R inner 3-point supporting method using the wafer support pins is currently broadly used for rapid thermal annealing of a wafer not greater than 8 inches.

However, as wafers become larger, weight of wafer also tends to become greater. Thus, the gravitational stress, which was not issued in 8-inch wafer, becomes a problem in 12-inch wafer, as explained later, so the conventional wafer supporting method is now insufficient for slip control.

SUMMARY OF THE INVENTION

The present invention is designed to solve the problems of the prior art, and therefore it is an object of the present invention to provide a wafer support pin having an improved structure to minimize gravitational stress and heat loss, thereby capable of minimizing slip dislocation; and a wafer annealing method using the same.

In order to accomplish the above object, in one aspect of the present invention, there is provided a wafer support pin, wherein a front end of the wafer support pin, contacted with the wafer, is flat or rounded to minimize gravitational stress during annealing the wafer.

Preferably, at least the front end of the wafer support pin is made of quartz material, and also at least the front end of the wafer support pin is made of monocrystalline or polycrystalline silicon.

In case at least the front end of the wafer support pin is made of silicon material, the monocrystalline or polycrystalline silicon may be doped with N or C to enhance mechanical strength. In addition, at least the front end of the wafer support pin may be surface-coated with SiC or $Si_3N_4$ to enhance abrasion resistance of the wafer support pin.

In addition, in the wafer pin used for annealing a wafer according to the present invention, a contact area between the front end and the wafer is controlled such that, after annealing, a pin mark has a minimum sectional area of $1.0 \times 10^{-3}$ $cm^2$, when being measured after Wright etching is conducted for 5 minutes to a contact portion between the wafer and the wafer support pin. Meanwhile, though there is no need to define an upper limit of this sectional area, the upper limit of the sectional area may be set as $2.0 \times 10^{-2}$ $cm^2$, for easier implementation. In addition, to obtain the sectional area of the pin mark, the front end of the wafer support pin is preferably flat or rounded, but the shape and structure of the support pin are not specifically limited if the sectional area is within the above range regardless of the structure of the support pin.

Meanwhile, in another aspect of the present invention, there is provided a wafer annealing method for annealing a wafer while supporting the wafer by contact points from a bottom thereof using wafer on a 0.7 R inner 3-point support pins, wherein an annealing temperature is in the range of 1,150 to 1,250° C., the wafer has a radius of 150 mm or more, and the wafer has a mass of 100 g or more.

In addition, there is also provided a wafer annealing method for annealing a wafer while supporting the wafer by point contact from a bottom thereof using wafer support pins, wherein, after annealing, a pin mark has a sectional area of $1.0 \times 10^{-3}$ to $2.0 \times 10^{-2}$ $cm^2$, when being measured after Wright etching is conducted for 5 minutes to a contact portion between the wafer and the wafer support pin.

DESCRIPTION OF THE PREFERRED EMBODIMENT

Hereinafter, preferred embodiments of the present invention will be described in detail with reference to the accompanying drawings.

Prior to the description, it should be understood that the terms used in the specification and the appended claims should not be construed as limited to general and dictionary meanings, but interpreted based on the meanings and concepts corresponding to technical aspects of the present invention on the basis of the principle that the inventor is allowed to define terms appropriately for the best explanation. Therefore, the description proposed herein is just a preferable example for the purpose of illustrations only, not intended to limit the scope of the invention, so it should be understood that other equivalents and modifications could be made thereto without departing from the spirit and scope of the invention.

Prior to explaining a wafer support pin according to the present invention, an analysis result after rapid thermal annealing is conducted to 8-inch and 12-inch wafers using a conventional wafer support pin (see FIG. 1a) with a sharp front end will be described first.

Specifically, two-stage rapid thermal annealing was conducted for 3 seconds at 1,120° C. and for 10 seconds at 1,215° C. with respect to 8-inch wafer and 12-inch wafer. At this time, the wafer support pin shown in FIG. 1a was used, and the wafer was supported using the three-point supporting method identically to the conventional case. After the two-stage annealing, slip dislocation was measured by means of pit observation using XRT (X-Ray Topography) and Wright etching, and a slip-free region was measured.

As a test result for the 8-inch wafer, no slip appears in XRT. Also, a rear surface portion of the wafer contacted with the support pin was cut in section, and Wright etching was conducted thereto for 5 minutes. After analyzing an etching pit therefrom, it was found that there is no slip up to 400 to 500 μm from the surface.

Figure 3:
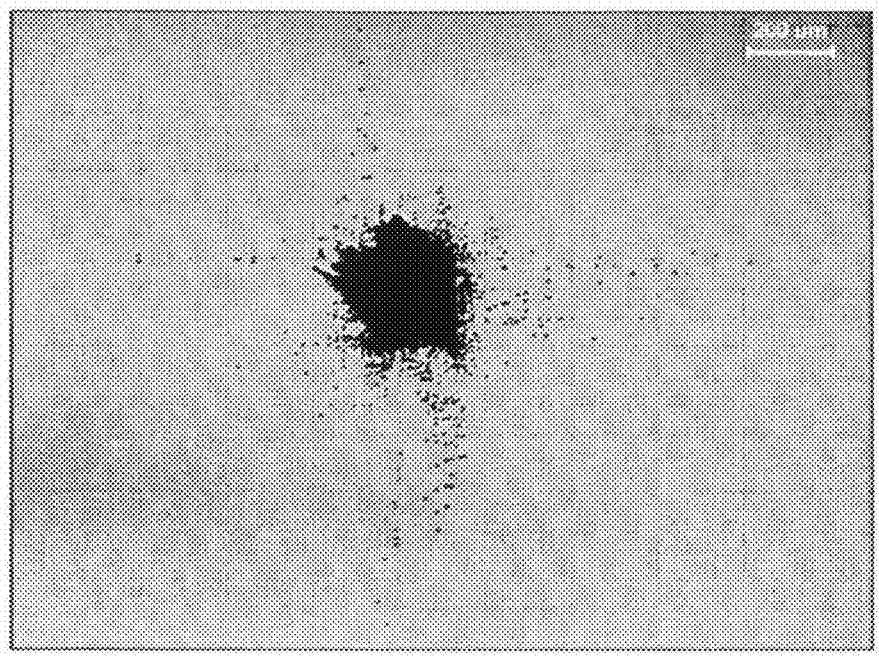
FIG. 3 is a photograph showing a pin mark appearing on a rear surface of the wafer in case Wright etching is conducted for 5 minutes to a pin contact point of the wafer after the two-stage rapid thermal annealing is conducted using the wafer support pin of FIG. 1.
Figure 4:
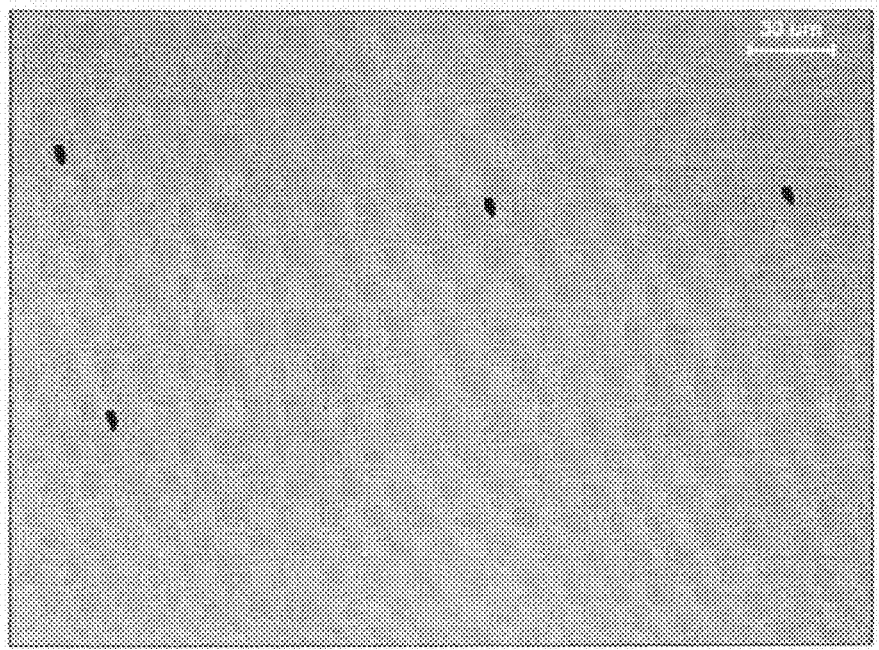
FIG. 4 is a photograph showing an etching pit appearing on a surface of wafer after the Wright etching of FIG. 3.

Meanwhile, in case of 12-inch wafer, after analyzing in the same manner, as a result of XRT measurement, no slip was found except that a pin mark is formed at a pin-contact point on the rear surface of the wafer. However, after the wafer is cut at the pin mark position of FIG. 3 and then checked using a microscope after conducting Wright etching thereto for 5 minutes, an etching pit was observed on the wafer surface as shown in FIG. 4. Under the assumption that thermal stress caused by the same rapid thermal annealing method is identical in spite of different diameters, the slip evaluation results of 8-inch and 12-inch wafers were as follows. Namely, gravitational stress is increased due to the increase of load of the wafer, so the slip was dislocated even to the wafer surface in case of the 12-inch wafer, though the slip was controlled in the 8-inch wafer. As mentioned above, it would be understood that, if the conventional wafer support pin and the conventional rapid thermal annealing method are applied to 12-inch wafer with a mass over 100 g as they were, an annealed wafer with a desired quality may not be obtained.

Figure 1:
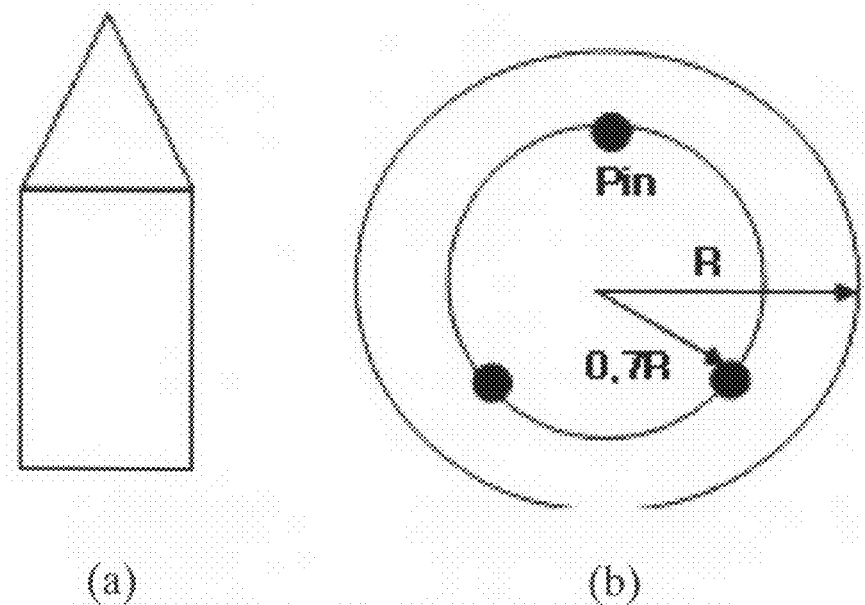
FIG. 1a is a sectional view showing a conventional wafer support pin used in rapid thermal annealing of a wafer and FIG. 1b is the center of gravity of a wafer on a 0.7 R inner 3-point support.
Figure 2:
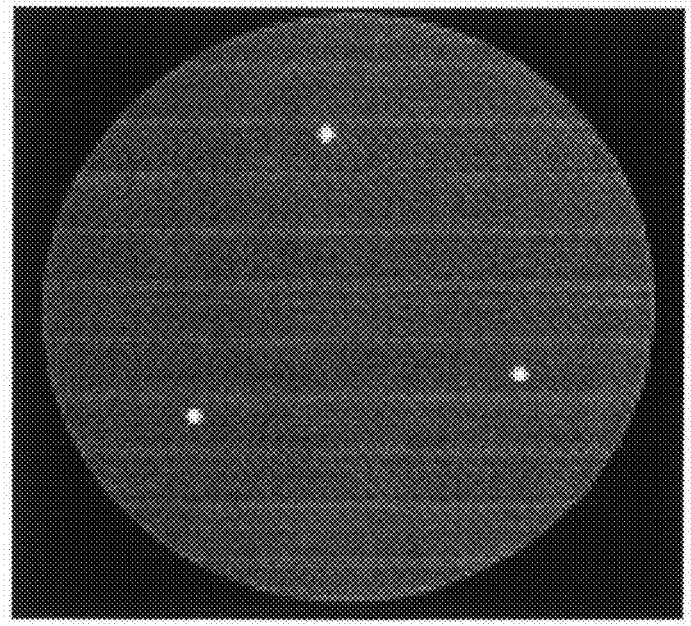
FIG. 2 is a XRT (X-Ray Topography) photograph showing a wafer after a two-stage rapid thermal annealing is conducted using the wafer support pin of FIG. 1b.

Meanwhile, as a scheme to minimize thermal stress in the thermal aspect, rapid thermal annealing may be realized in a way of applying a lower temperature increasing rate/decreasing rate than a conventional temperature increasing rate/decreasing rate, though the conventional support pin shown in FIG. 1a is used. However, this scheme is undesirable in aspect of productivity. Thus, as another scheme to reduce thermal stress without lowering temperature increasing rate/decreasing rate, the following experiment was conducted.

Figure 5:
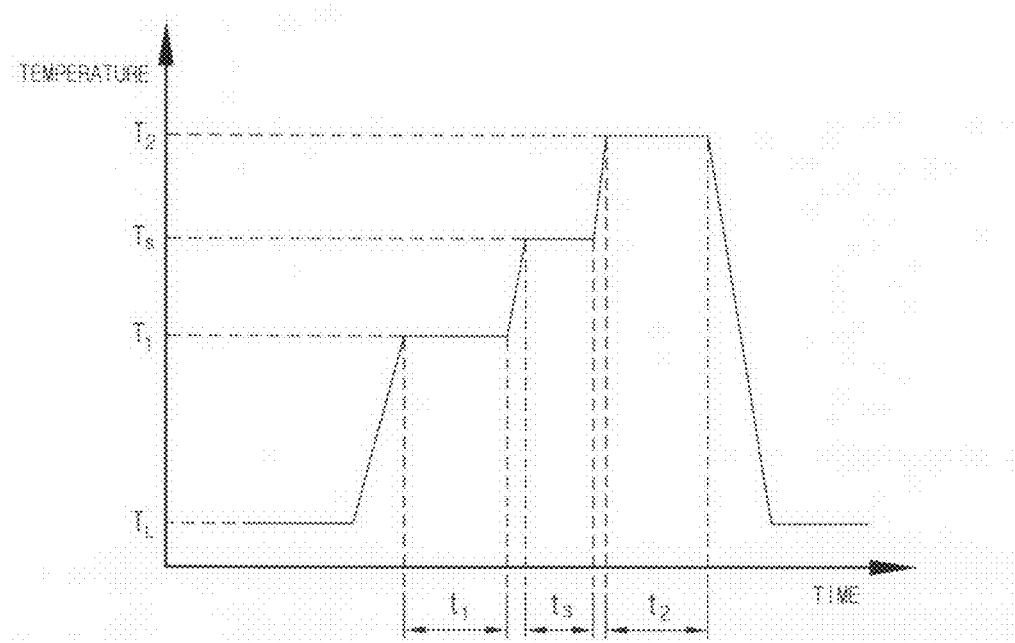
FIG. 5 is a diagram showing an annealing process to which an intermediate stabilization step is added to the two-stage rapid thermal annealing in order to prevent slip dislocation according to the present invention.

That is to say, as shown in FIG. 5, in the process of conducting rapid thermal annealing at a first temperature $T_1$, then increasing the temperature and conducting rapid thermal annealing at a second temperature $T_2$, an intermediate stabilization step $t_s$ was inserted. Namely, in a step of increasing a temperature from the first temperature $T_1$ to the second temperature $T_2$, a step for stabilization during 1 to 10 seconds at a temperature $T_2$ between the first and second temperatures was inserted such that thermal stress was reduced during increasing the temperature to a high temperature to prevent slip.

More specifically, the first temperature $T_1$ was in the range of 900 to 1,200° C., and 1,120° C. at this experiment. The second temperature $T_2$ was in the range of 1,120 to 1,250° C., and 1,215° C. at this experiment. Also, the temperature $T_s$ of the intermediate stabilization step was set to three temperatures of (a) 1,130° C., (b) 1,150° C. and (c) 1,180° C., thereby making thermally stable environments for 5 seconds, respectively. After that, the temperature was lowered at a decreasing rate of 30° C./sec, and then a slip dislocation result was measured.

Figure 6:
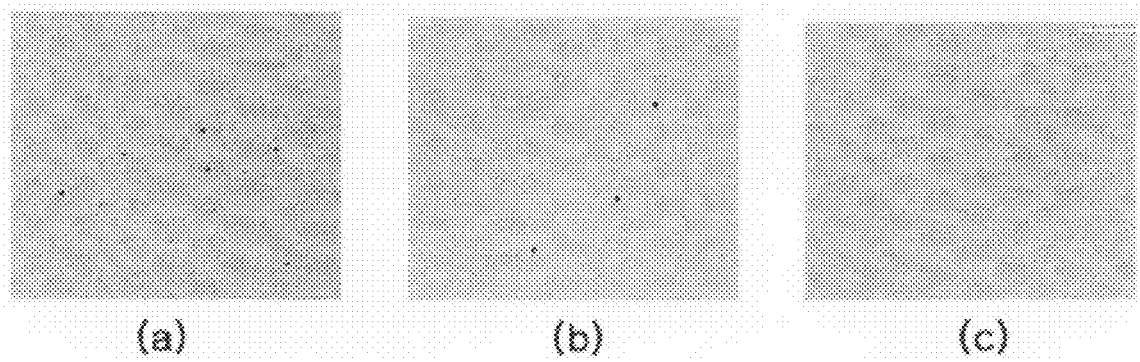
FIG. 6 is a photograph obtained by analyzing slips of a wafer surface according to a temperature of the intermediate stabilization step for prevention of slip dislocation in the diagram of FIG. 5.

As the result, FIG. 6 is a photograph obtained in a way of conducting the thermal annealing process of FIG. 5 and then conducting Wright etching for 5 minutes, and then observing an etching pit on a wafer surface using a microscope. (a), (b) and (c) of FIG. 6 are respectively photographs obtained at cases that the temperature $T_s$ of the intermediate stabilization step is set to (a) 1,130° C., (b) 1,150° C. and (c) 1,180° C., respectively. Seeing FIG. 6, the number of etching pits appearing on the wafer surface is respectively (a) 6, (b) 3 and (c) 0, so it would be understood that an etching pit density on the wafer surface tends to decrease as the temperature of the intermediate stabilization step is increased. In particularly, when the temperature of the intermediate stabilization step is 1,180° C., there is no slip on the wafer surface.

Figure 7:
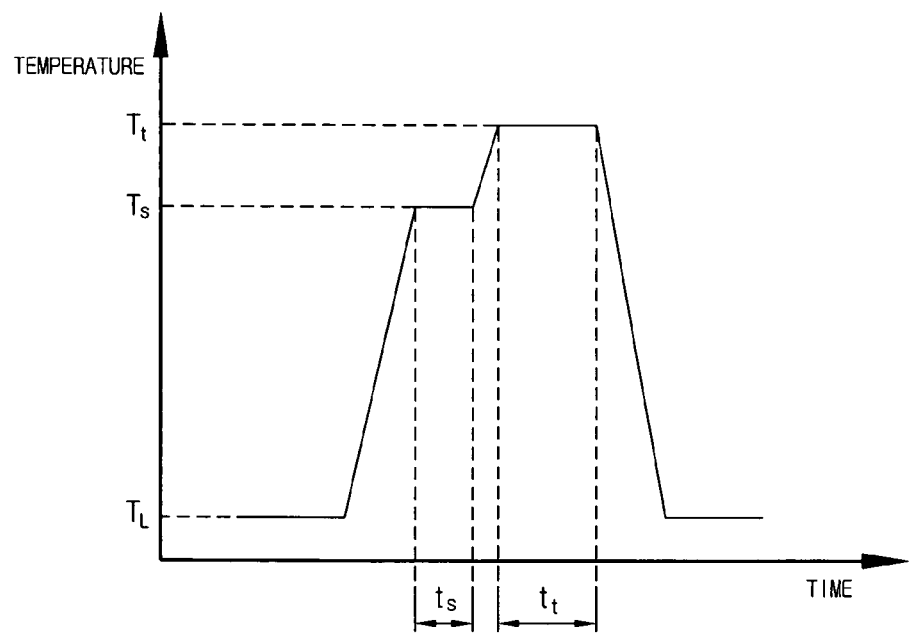
FIG. 7 is a diagram showing the annealing process to which a thermal treatment step is added to a one-stage rapid thermal annealing in order to prevent slip dislocation according to the present invention.

In addition, this intermediate stabilization step may be applied not only to the two-stage rapid thermal annealing but also to a one-stage rapid thermal annealing. That is to say, as shown in FIG. 7, when a wafer is rapidly annealed in one stage at a high temperature of 1,120° C. or above, in a step for increasing a temperature from a wafer loading temperature $T_L$ to a highest target temperature $T_f$, a step for intermediate stabilization at a temperature $T_s$ lower than the highest target temperature may be included to reduce thermal stress applied to the wafer, thereby controlling slip.

In conclusion, if a large-diameter wafer of 12 inch or above is rapidly annealed using a conventional wafer support pin with a sharp front end, the gravitational stress is increased according to the increase of load of the wafer, so it would be difficult to control slip. Meanwhile, as shown in FIGS. 5 and 7, if the step for stabilization at a temperature lower than a highest target temperature is inserted before reaching the highest target temperature, it would be understood that slip on a wafer surface is meaningfully decreased since thermally stress is reduced, though a conventional wafer support pin is used. However, though the intermediate stabilization step is inserted as mentioned above, the slip control effect may be insufficient depending on the temperature of the intermediate stabilization step, and there is also a limit in obtaining a sufficient slip-free depth, so a more fundamental solution is needed.

Figure 8:
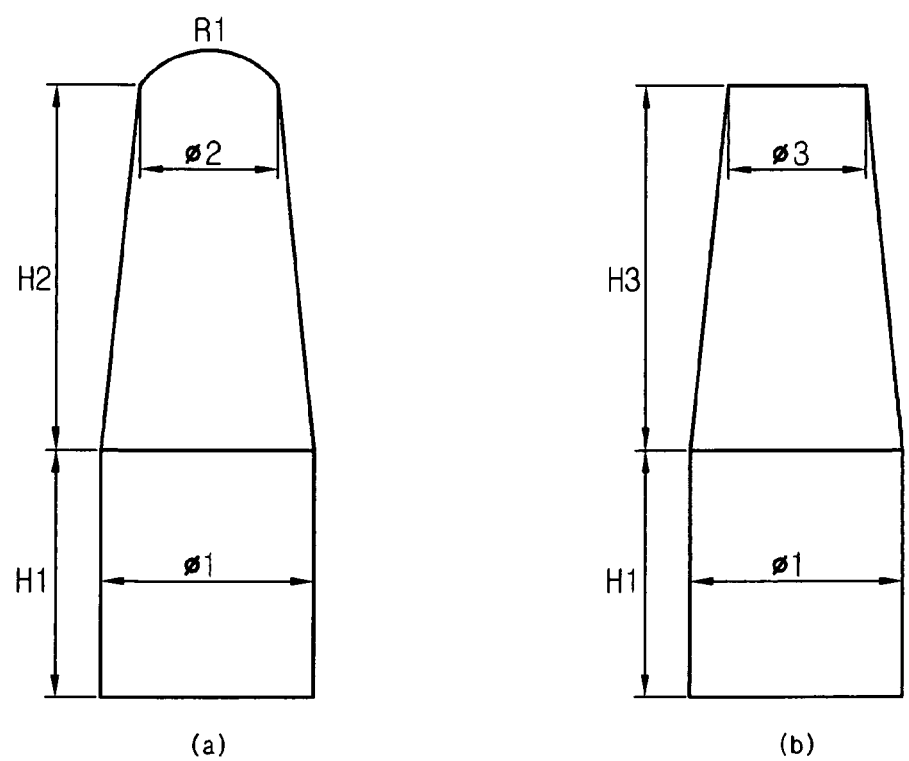
FIG. 8 is a sectional view showing a wafer support pin according to the present invention.

Accordingly, inventors of the present invention changed a structure of a wafer support pin. That is to say, the wafer support pin according to the present invention has a front end that is rounded or flat, as shown in FIG. 8. It is for increasing a contact area between a wafer and a support pin and thus distributing a load so as to reduce gravitational stress of the wafer.

More specifically, the wafer support pin shown in (a) of FIG. 8 has a rounded front end and a tapered portion. The tapered portion preferably has a length H2 of 2 to 17 mm, and the rounded portion of the front end preferably has a diameter φ2 of 0.5 to 1.5 mm, though not limited thereto. Also, the rounded portion preferably has a radius of curvature R1 of 0.7 mm or more.

The wafer support pin shown in (b) of FIG. 8 is similar to the support pin shown in (a) of FIG. 8, except that its front end is flat. That is to say, the support pin shown in (b) of FIG. 8 is corresponding to a support pin shown in (a) of FIG. 8 in which its rounded portion has an infinite radius of curvature. Meanwhile, in the support pin shown in (b) of FIG. 8, the front end preferably has a flat portion with a diameter φ3 of 0.2 to 1.5 mm, and the tapered portion preferably has a length H3 of 2 to 17 mm, though not limited thereto.

The wafer support pin shown in FIG. 8 may be made of quartz as in the prior art, and it may also be made of monocrystalline or polycrystalline silicon. However, in aspect of material, an essential portion of the wafer support pin is a front end contacted with a wafer, so at least the front end (or, even the tapered portion) should be made of the above material. In addition, in case the support pin is made of silicon, N or C may be doped on the monocrystalline or polycrystalline silicon to enhance mechanical strength. Further, at least the front end may be surface-coated with SiC or $Si_3N_4$ to enhance abrasion resistance of the support pin.

As mentioned above, when rapidly annealing a large-diameter wafer such as 12-inch wafer, slip can be controlled by reducing the gravitational stress of the wafer in a way of rounding or making flat the front end of the wafer support pin. Hereinafter, after rapid thermal annealing is conducted to 12-inch wafer using the wafer support pin manufactured according to the present invention, its analysis result will be explained as an example.

First, a wafer support pin made of quartz material similarly to the conventional support pin but having a rounded front end as shown in (a) of FIG. 8 was manufactured. At this time, the front end was designed to have three radii of curvature: (a) 0.4 mm, (b) 0.7 mm, and (c) 1 mm.

Subsequently, the two-stage rapid thermal annealing as mentioned above was conducted to 12-inch wafer. That is to say, while supporting the 12-inch wafer at three points using the support pins prepared as mentioned above, two-stage rapid thermal annealing for 3 seconds at 1,120° C. and for 10 seconds at 1,215° C. was conducted. At this time, an intermediate stabilization step as mentioned above was not inserted.

Figure 9:
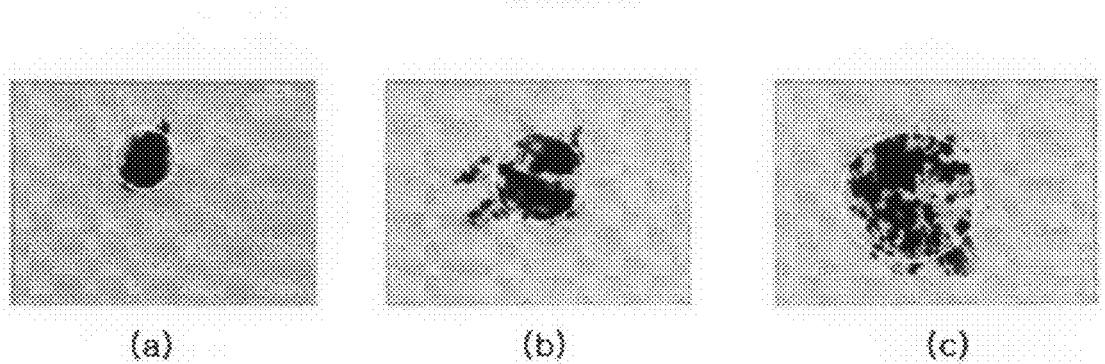
FIG. 9 is a photograph showing a pin mark appearing on a rear surface of a wafer when Wright etching is conducted for 5 minutes to a pin contact point of the wafer after the two-stage rapid thermal annealing is conducted using the wafer support pin shown in (a) of FIG. 8, wherein (a) of FIG. 9 is the case that a front end of the support pin has a radius of curvature of 0.4 mm, (b) is the case of 0.7 mm, and (c) is the case of 1 mm.

After the two-stage annealing, Wright etching was conducted for 5 minutes as mentioned above, and then a pin mark on a rear surface of the wafer was observed using a microscope. As a result, as shown in FIG. 9, contact areas between the support pin and the wafer was respectively observed as (a) $0.5 \times 10^{-3}$ cm², (b) $1.0 \times 10^{-3}$ cm², and (c) $2.1 \times 10^{-3}$ cm² with respect to the support pins having the above three radii of curvature. In addition, to measure a slip-free depth, the wafer was cut in section at a position of pin mark, Wright etching was conducted thereto for 5 minutes, and then a greatest height of an etching pit rising from the rear surface of the wafer was measured to obtain a slip-free region on the wafer surface. Thus, the results as shown in FIG. 10 were obtained.

Figure 10:
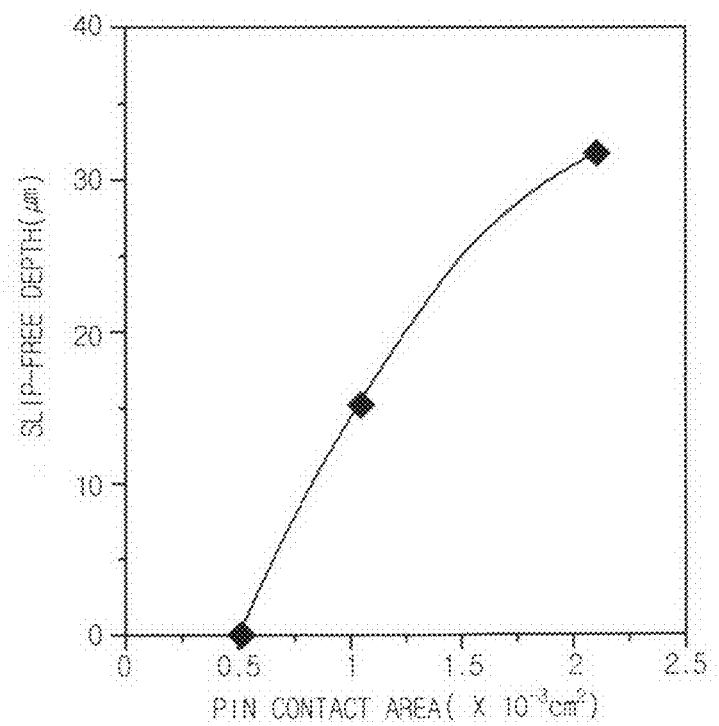
FIG. 10 is a graph showing a slip-free depth of the wafer surface according to a contact area of the pin after the Wright etching of FIG. 9 is conducted.

Seeing FIG. 10, it would be understood that the slip-free depth is substantially 0 in case (a) a radius of curvature is 0.4 mm and a contact area is $0.5 \times 10^{-3}$ cm², the slip-free depth is substantially 15 μm in case (b) a radius of curvature is 0.7 mm and a contact area is $1.0 \times 10^{-3}$ cm², and the slip-free depth is over 30 μm in case (c) a radius of curvature is 1 mm and a contact area is $2.1 \times 10^{-3}$ cm². Thus, in order to obtain a rapidly annealed slip-free wafer to a depth of 15 μm from the wafer surface, it is preferred that the front end of the wafer support pin has a radius of curvature of at least 0.7 mm, and a contact area between the wafer and the support pin, measured after Wright etching for 5 minutes, is at least $1.0 \times 10^{-3}$ cm². Meanwhile, though there is no need to define an upper limit of this sectional area, the upper limit of the sectional area may be set as $2.0 \times 10^{-2}$ cm², for easier implementation.

Meanwhile, seeing FIG. 10, when the contact area is increased from (a) $0.5 \times 10^{-3}$ cm² to (b) $1.0 \times 10^{-3}$ cm², the slip-free depth is substantially linearly increased, while, when the contact area is increased from (b) $1.0 \times 10^{-3}$ cm² to (c) $2.1 \times 10^{-3}$ cm², the increase of slip-free depth tends to slow down. Accordingly, the inventors grew an oxide film on a wafer and then checked the change of thickness of the oxide film in order to find a factor thereof. That is to say, rapid thermal oxidation (RTO) was conducted for 30 seconds under the condition of 1,150° C. and $O_2$ gas flow rate of 10 slm to grow a silicon oxide film in a thickness of 100 Å on the wafer, and then a thickness deviation of the oxide film was obtained using an ellipsometer. In the measurement of thickness deviation of the oxide film formed by rapid thermal oxidation, a temperature deviation during rapid thermal annealing is indirectly measured. Namely, under the above conditions (1,150° C., 30 seconds, $O_2$ gas flow rate of 10 slm), an oxide film is grown in a thickness of 100 Å, and when the thickness of the oxide film shows deviation of 0.7 Å, an actual temperature deviation is calculated as 1° C.

Meanwhile, the wafer support pin used at this time is made of quartz material with its front end rounded as shown in (a) of FIG. 8, and its radius of curvature is prepared in two cases of 0.4. mm and 1 mm so as to measure a thickness deviation according to the difference of contact areas. Then, as shown in (a) of FIG. 11, a wafer is supported using the support pins with different radii of curvature at the same time (in FIG. 11, A is a support pin having a radius of curvature of 0.4 mm, and B is a support pin having a radius of curvature of 1 mm).

Figure 11:
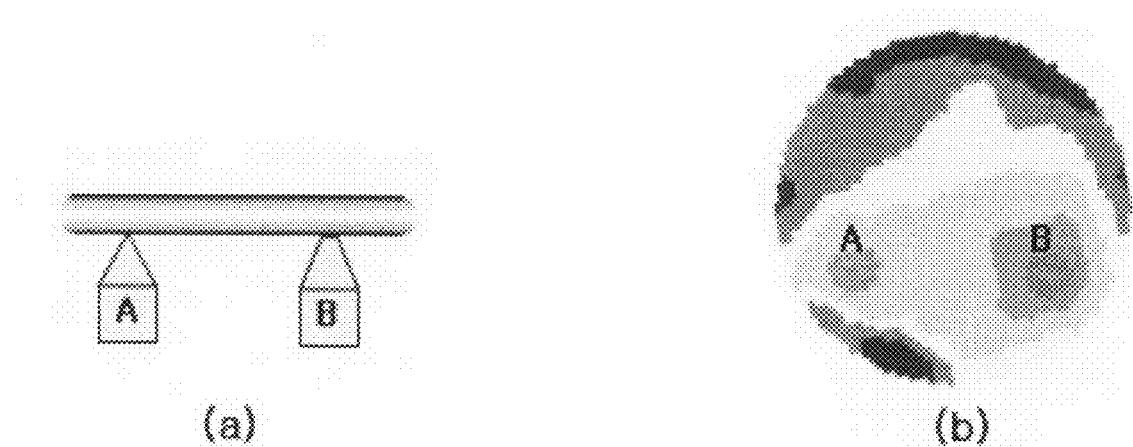
FIG. 11 shows a thickness of an oxide film measured using an ellipsometer after rapid thermal oxidation using support pins prepared by differently changing a radius of curvature of the front end of the support pin shown in (a) of FIG. 8.

Seeing (b) of FIG. 11 showing a measurement result of the ellipsometer, there appear two points A, B where the oxide film has locally thin thickness at the contact portion of the support pin, and a greater point appears at the B point where the contact area is great, so it would be understood that the thickness deviation of the oxide film becomes greater as the contact area is increased. That is to say, as the contact area between the wafer and the support pin is greater, good influence is given to the slip control in aspect of reduction of gravitational stress, but a greater contact area causes heat loss through the contact point to cause local temperature deviation, thereby increasing thermal stress. Thus, it would be understood that, as the contact area increases, the increase of slip-free depth tends to slow down, as shown in FIG. 10.

Accordingly, in order to supplement the drawback that an increased contact area increases thermal stress (heat loss) to reduce the increase of slip-free depth, the inventors make a wafer support pin using silicon identically to the wafer in consideration of thermal conductivity and thermal expansion coefficient during the annealing. That is to say, the support pin of this embodiment is manufactured such that the front end is made of rounded silicon material as shown in (a) of FIG. 8, and the front end is designed to have two radii of curvature of 0.4 mm and 1 mm, respectively. The two-stage rapid thermal annealing (1,120° C. and 3 seconds; and 1,215° C. and 10 seconds) identical to the former case was conducted using the support pin prepared as above, and then the same Wright etching was used to measure a pin mark on a rear surface of the wafer and a slip-free depth of the wafer surface.

Figure 12:
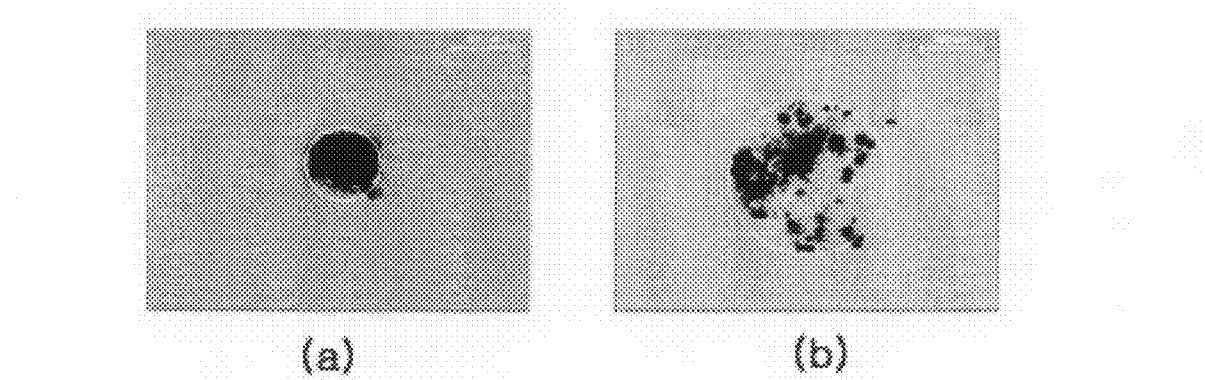
FIG. 12 is a photograph showing a pin mark appearing on a rear surface of wafer in case rapid thermal annealing is conducted using a support pin made of silicon and prepared by differently changing a radius of curvature of the front end of the support pin shown in (a) of FIG. 8.
Figure 13:
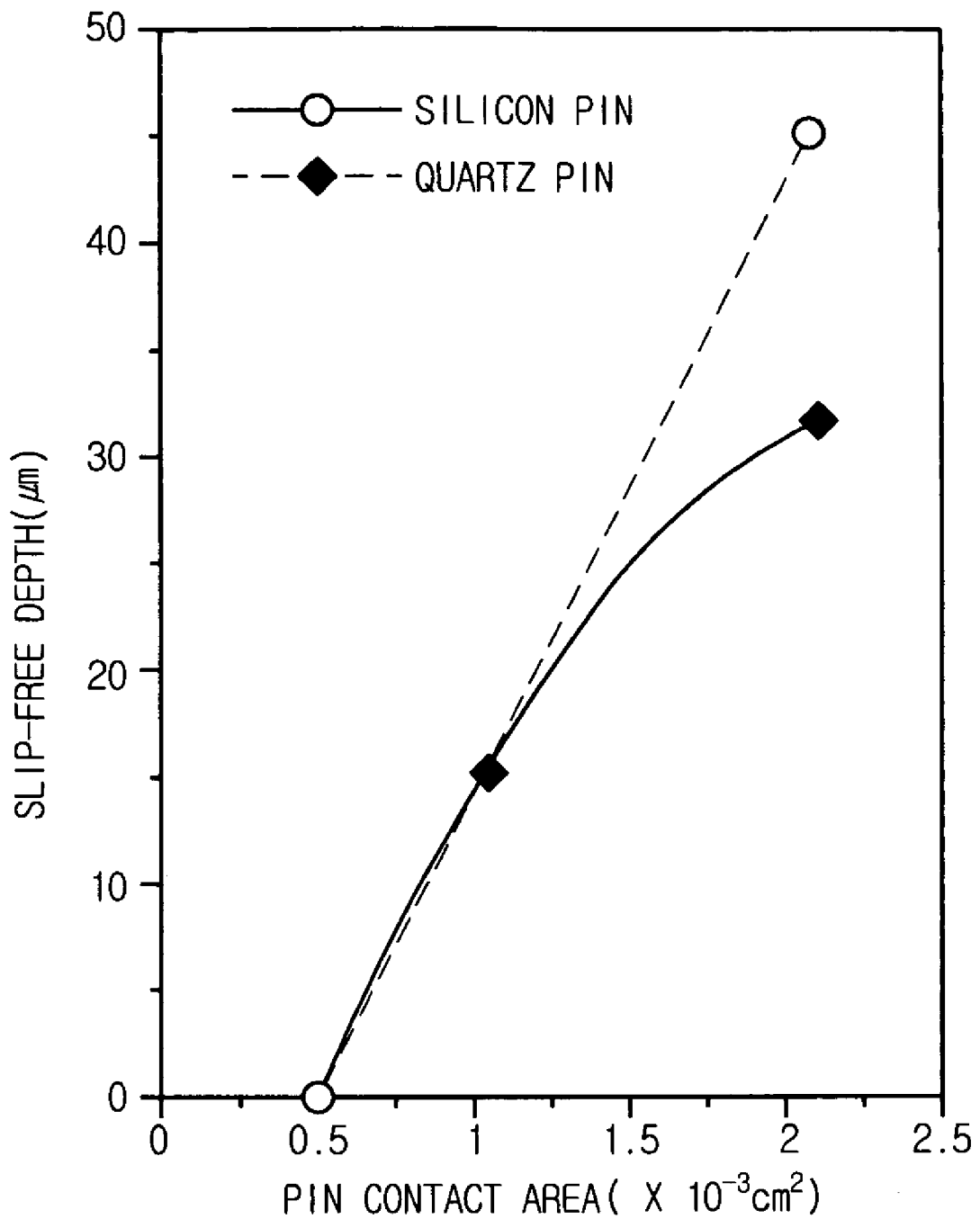
FIG. 13 is a graph showing a slip-free depth according to pin materials.

As a result, as shown in FIG. 12, the contact area was found as (a) $0.5 \times 10^{-3}$ cm$^2$ in case the support pin has a radius of curvature of 0.4 mm, and (b) $2.1 \times 10^{-3}$ cm$^2$ in case the support pin has a radius of curvature of 1 mm. These results are respectively corresponding to (a) and (c) of FIG. 9. Meanwhile, in order to measure the slip-free depth, Wright etching was conducted for 5 minutes and then an etching pit was observed using a microscope. As a result, in case the support pin having a radius of curvature of 1 mm is used, the slip-free depth was found as about 45 μm. That is to say, as shown in FIG. 13, in case a support pin made of quartz material is used, the increase of slip-free depth slows down according to the increase of the contact area, while, in case the support pin made of silicon material is used as in this embodiment, the slip-free depth is linearly increased in proportion to the increase of the contact area. That is to say, in view of slip control, it means that a support pin made of silicon material is more advantageous than a support pin made of quartz material.

Meanwhile, in the above embodiments and experimental examples, the rapid thermal annealing using the wafer support pin according to the present invention, namely a support pin having a flat or rounded front end, was illustrated as the two-stage rapid thermal annealing, but the rapid thermal annealing using the wafer support pin of the present invention is not limited to the above two-stage rapid thermal annealing. That is to say, the wafer support pin of the present invention may be applied to one-stage rapid thermal annealing, and it may also be used for common annealing, not rapid thermal annealing. Further, the above wafer support pin may be used for rapid thermal annealing to which the intermediate stabilization step explained with reference to FIGS. 5 and 7 is inserted.

The present invention has been described in detail. However, it should be understood that the detailed description and specific examples, while indicating preferred embodiments of the invention, are given by way of illustration only, since various changes and modifications within the spirit and scope of the invention will become apparent to those skilled in the art from this detailed description.

APPLICABILITY TO THE INDUSTRY

According to the present invention, a wafer support pin used for annealing has a front end contacted with a wafer such that the front end is formed flat or rounded, so gravitational stress accompanied with a large-diameter wafer is reduced to effectively control slip dislocation, thereby capable of giving a high quality annealed wafer.

In addition, according to the rapid thermal annealing method of a wafer of the present invention, an intermediate stabilization step is executed at a temperature lower than a target temperature before reaching an annealing target temperature, so thermal stress applied to the wafer may be reduced to prevent slip.

What is claimed is:

1. A wafer support pin for supporting a wafer during annealing of the wafer from a bottom,
   wherein a front end of the wafer support pin, contacted with the wafer, is flat or rounded, and
   wherein the front end of the wafer support pin has a tapered shape, and a tapered portion has a length of 2 to 17 mm.

2. The wafer support pin according to claim 1,
   wherein at least the front end of the wafer support pin is made of quartz material.

3. The wafer support pin according to claim 1,
   wherein at least the front end of the wafer support pin is made of monocrystalline or polycrystalline silicon.

4. The wafer support pin according to claim 3,
   wherein the monocrystalline or polycrystalline silicon is doped with N or C.

5. The wafer support pin according to claim 3,
   wherein at least the front end of the wafer support pin is surface-coated with SiC or Si3N4.

6. The wafer support pin according to claim 1,
   wherein the front end of the wafer support pin has a flat portion with a diameter of 0.2 to 1.5 mm, and
   wherein, after annealing the wafer using the wafer support pin, a pin mark formed on a contact portion between the wafer and the wafer support pin has a sectional area of 1.0×10−3 to 2.0×10−2 cm2, when being measured after Wright etching is conducted for 5 minutes to the contact portion between the wafer and the wafer support pin.

7. The wafer support pin according to claim 1,
   wherein the front end of the wafer support pin is rounded, and the rounded portion has a radius of curvature of 0.7 mm or more.

8. The wafer support pin according to claim 7,
   wherein the rounded portion of the front end of the wafer support pin has a diameter of 0.5 to 1.5 mm, and
   wherein, after annealing the wafer using the wafer support pin, a pin mark formed on a contact portion between the wafer and the wafer support pin has a sectional area of 1.0×10−3 to 2.0×10−2 cm2, when being measured after Wright etching is conducted for 5 minutes to the contact portion between the wafer and the wafer support pin.

9. A wafer support pin for supporting a wafer by point contact from a bottom thereof during annealing the wafer, wherein, after annealing the wafer using the wafer support pin, a pin mark formed on a contact portion between the wafer and the wafer support pin has a sectional area of $1.0 \times 10^{-3}$ to $2.0 \times 10^{-2}$ cm2, when being measured after Wright etching is conducted for 5 minutes to the contact portion between the wafer and the wafer support pin.

10. The wafer support pin according to claim 9, wherein the point contact is 0.7 R inner 3-point contact.

* * * * *